United States Patent
Ha et al.

(10) Patent No.: US 6,339,251 B2
(45) Date of Patent: *Jan. 15, 2002

(54) WAFER GROOVES FOR REDUCING SEMICONDUCTOR WAFER WARPING

(75) Inventors: Min-Seok Ha, Kyungki-do; Jin-Kee Choi, Seoul; Cheol Jeong, Kyungki-do, all of (KR)

(73) Assignee: Samsung Electronics Co., LTD (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/451,209

(22) Filed: Nov. 29, 1999

Related U.S. Application Data

(62) Division of application No. 09/190,044, filed on Nov. 10, 1998.

(51) Int. Cl.$^7$ ............................................. H01L 23/544
(52) U.S. Cl. ........................................ 257/620; 438/113
(58) Field of Search .............................. 257/620, 622; 438/113, 462

(56) References Cited

U.S. PATENT DOCUMENTS

| | | | |
|---|---|---|---|
| 3,654,000 A | 4/1972 | Totah et al. | 156/17 |
| 4,681,656 A | * 7/1987 | Byrum | 156/645 |
| 5,266,528 A | * 11/1993 | Yamada | 437/226 |
| 5,393,706 A | 2/1995 | Mignardi et al. | 437/226 |
| 5,547,906 A | 8/1996 | Badehi | 437/227 |
| 5,597,767 A | 1/1997 | Mignardi et al. | 437/227 |
| 5,786,266 A | 7/1998 | Boruta | 438/462 |
| 5,814,532 A | 9/1998 | Ichihara | 4387/33 |
| 5,824,177 A | 10/1998 | Yoshihara et al. | 156/250 |
| 5,837,378 A | 11/1998 | Mathews et al. | 438/439 |
| 5,851,928 A | 12/1998 | Cripe et al. | 438/748 |
| 5,952,679 A | * 9/1999 | Kitou et al. | 257/77 |
| 6,025,639 A | * 2/2000 | Mitwalsky et al. | 257/620 |

FOREIGN PATENT DOCUMENTS

JP    4-302432    10/1992    ................. 231/322

* cited by examiner

Primary Examiner—Olik Chaudhuri
Assistant Examiner—Douglas A. Wille
(74) Attorney, Agent, or Firm—Myers Bigel Sibley & Sajovec

(57) ABSTRACT

A method of preparing a semiconductor wafer includes the step of forming first and second layers of a first material on opposing respective first and second faces of the semiconductor wafer. The second layer of the first material is then removed from the second face of the semiconductor wafer. More particularly, the first material can be polysilicon. Warping of the semiconductor wafer can thus be reduced.

5 Claims, 5 Drawing Sheets

WAFER GROOVES FOR REDUCING SEMICONDUCTOR WAFER WARPING

RELATED APPLICATION

This application is a divisional application of U.S. patent application Ser. No. 09/190,044 filed Nov. 10, 1998 and entitled METHODS INCLUDING WAFER GROOVES FOR REDUCING SEMICONDUCTOR WAFER WARPING AND RELATED STRUCTURE.

FIELD OF THE INVENTION

The present invention relates to the field of integrated circuits and more particularly to methods and structures for reducing warping of integrated circuit wafers.

BACKGROUND OF THE INVENTION

As semiconductor integrated circuit devices have become more highly integrated to provide greater processing and/or memory capacity, chip sizes and deposition thickness have also increased. Accordingly, semiconductor wafer diameters have increased to provide increased numbers of the larger integrated circuit devices thereon. In other words, larger diameter semiconductor wafers can be used to fabricate larger numbers of integrated circuit devices.

The total thickness of layers deposited on semiconductor wafers may also increase because the more highly integrated devices may include a greater number of layers. Accordingly, more highly integrated devices may include a greater number of deposition, heat treatment, photolithography, and etching steps during the fabrication thereof, and the resulting stresses may cause the wafer to warp. In particular, depositions and thermal treatments at high temperatures of hundreds of degrees Celsius may stress the semiconductor wafer and cause warping.

For example, wafer warping has been observed during the fabrication of 64M dynamic random access memory (DRAM) devices, and wafer warping is likely to increase with higher capacity memory devices and with the use of larger diameter wafers. For example, when forming a polysilicon layer to provide gate electrodes for a DRAM, polysilicon layers may be formed on both the device side of the wafer and the backside of the wafer. Only the polysilicon layer on the device side of the wafer, however, is typically patterned so that differences in the stresses due to thermal expansion caused by the patterned and unpatterned polysilicon layers may cause wafer warping.

A technique for reducing warping is discussed in Japanese Patent Application No. 4-302432 which has been laid open. In the 4-302432 application, grooves are formed in the polysilicon layer on the backside of the wafer. Formation of these grooves, however, may make it difficult to hold the device side of the wafer even so that it is difficult to ensure focus margins during subsequent photolithography exposure steps. In other words, the grooves in the polysilicon layer on the backside of the wafer may make it difficult to support the wafer during photolithography exposure steps so that the device side of the wafer is maintained within a common focal plane. Furthermore, while this technique may reduce concave wafer warping, this technique may not address convex wafer warping.

SUMMARY OF THE INVENTION

It is therefore an object of the present invention to provide methods and structures that reduce wafer warping.

This and other objects are provided according to the present invention by forming first and second layers of a first material on opposing respective first and second faces of the semiconductor wafer, and removing the second layer of the first material from the second face of the semiconductor wafer. By removing the second layer, warping of the wafer can be reduced. More particularly, the first material can be polysilicon, and the first layer of the material can be patterned to form transistor gate electrodes for DRAM devices. By removing the second layer, thermal stress differences between a patterned and unpatterned polysilicon layers on opposing faces of a wafer can be reduced thereby reducing warping.

In addition, removal of the second layer can be followed by forming an electronic device on the first face of the semiconductor wafer. Furthermore, a plurality of electronic devices can be formed to provide a plurality of DRAM devices on the wafer. In addition, the formation of the first and second layers of the first material can be preceded by forming a gate oxide layer on the first face of the semiconductor wafer so that the first face of the semiconductor wafer and the first layer of the first material are separated by the gate oxide layer. The first layer of the first material and the gate oxide layer can then be patterned to form a plurality of transistor gate electrodes.

According to an alternate aspect of the present invention, a method of preparing a semiconductor wafer to reduce distortion thereof during the subsequent fabrication of integrated circuit devices is provided. In particular, grooves are formed in the device surface of the semiconductor wafer wherein the grooves are within scribe line regions of the semiconductor wafer. These grooves can reduce distortions in the wafer such as warping and convexing during the subsequent formation of integrated circuit devices on the wafer.

The methods and structures of the present invention can thus reduce warping of semiconductor wafers during the fabrication of integrated circuit devices thereon.

DETAILED DESCRIPTION

Figure 1A:
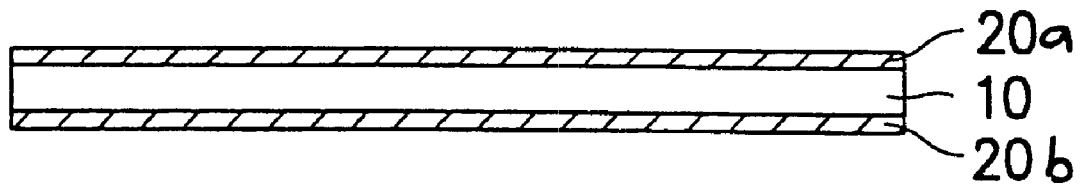
FIGS. 1A to 1D are cross sectional views illustrating steps of reducing wafer warping according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

FIGS. 1A to 1D are cross sectional views illustrating steps of a method for reducing concave wafer warping according to the present invention. As shown in FIG. 1A, first and second layers 20a and 20b of a first material such as polysilicon are formed on opposing faces of the semiconductor wafer 10. In particular, the upper face of the semiconductor wafer can be the device surface on which DRAM devices are formed, and the first layer 20a of polysilicon may be used to provide transistor gate electrodes for the DRAM devices. Furthermore, a gate dielectric layer such as a gate oxide layer may be formed on the upper surface of the wafer adjacent the first layer 20a.

The second layer 20b, however, may serve no function and may cause concave warping during subsequent thermal treatments or depositions. For example, the second layer 20b may be formed simultaneously when the first layer 20a is formed by chemical vapor deposition.

Figure 1B:
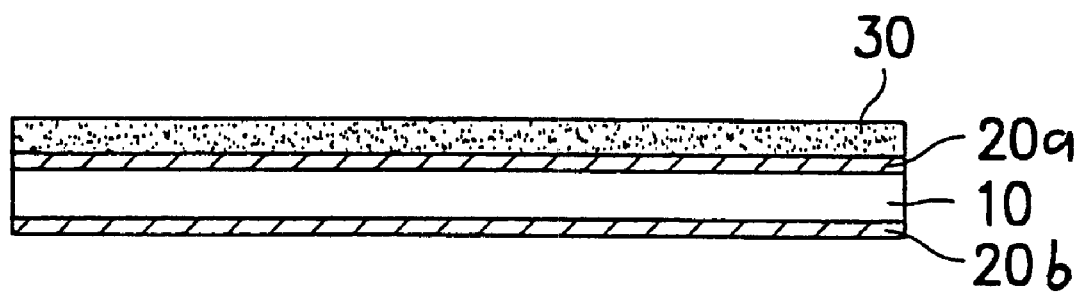

A layer 30 of a second material such as photoresist is then formed on the first layer 20a as shown in FIG. 1B. The second material preferably has an etch selectivity different from that of the first material. In other words, the second material can preferably resist etching with respect to an etchant used to etch the first material.

Figure 1C:
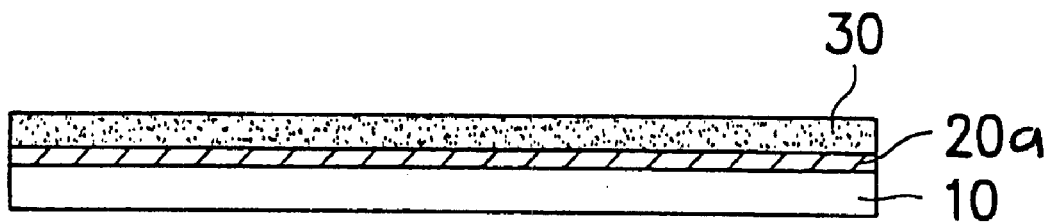
Figure 1D:
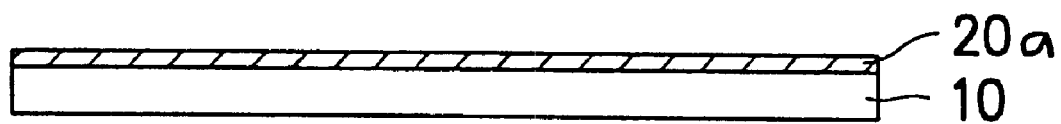

As shown in FIG. 1C, the second layer 20b of the first material is then removed. In particular, the layer 30 of the second material can serve as an etching mask thereby protecting the first layer 20a of the first material while etching the second layer 20b of the first material. The layer 30 of the second material can then be removed as shown in FIG. 1D. As shown in FIG. 1C, the layer 30 can be a continuous layer so that the first layer 20a of the first material is maintained as a continuous layer as shown in FIG. 1D.

In summary, when forming a polysilicon layer on a device surface of a semiconductor wafer to be used as a gate electrode layer in a plurality of DRAM devices, a polysilicon layer may also be formed on the backside of the semiconductor wafer. Wafer warping can be reduced according to the present invention by removing the polysilicon layer from the backside of the wafer while maintaining the polysilicon layer on the device side of the wafer. By removing the material layer from the backside of the wafer, concave warping can be reduced, and a smooth and even wafer backside can be provided. Accordingly, the device side of the wafer can be maintained in a common focal plane during subsequent photolithographic exposing steps.

Figure 2:
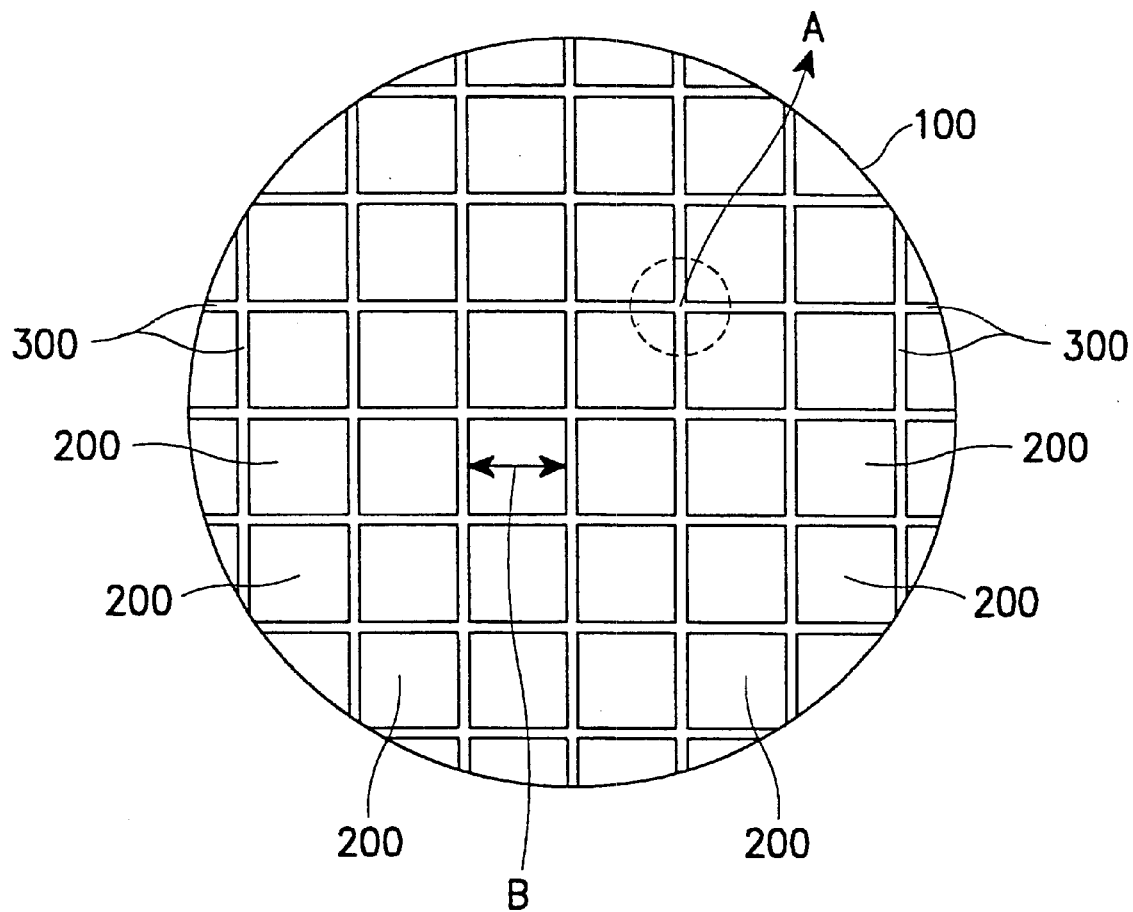
FIG. 2 is a plan view of a wafer including device regions and scribe lines according to the present invention.
Figure 3:
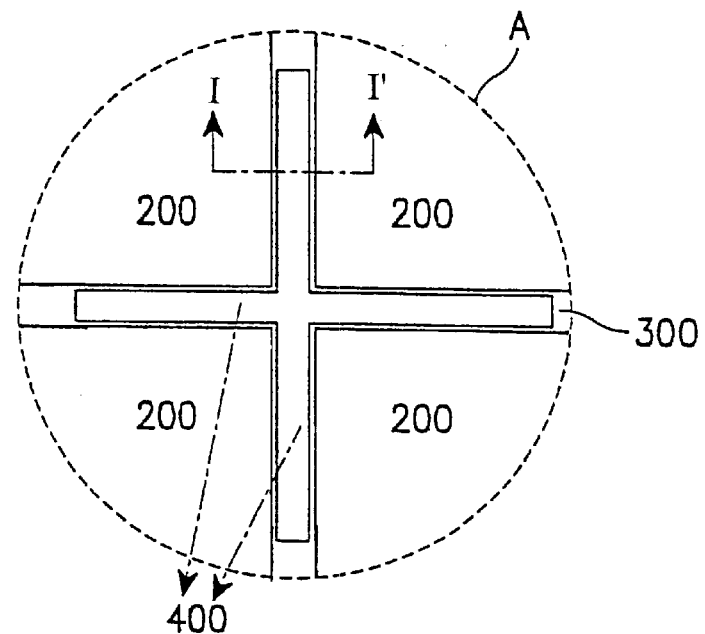
FIGS. 3 and 4 are alternate enlarged views of area A of FIG. 2.
Figure 4:
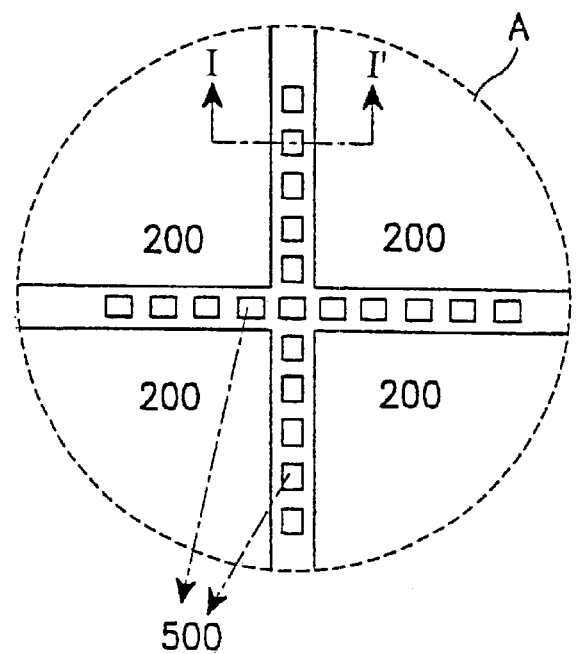

FIGS. 2, 3, and 4 are views illustrating a semiconductor wafer with grooves to reduce convex warping. As shown in FIG. 2, a semiconductor wafer 100 includes a plurality of integrated circuit device regions 200 and scribe line regions 300 therebetween. An integrated circuit device can be formed in each of the integrated circuit device regions 200, and the integrated circuit device regions are separated by the scribe line regions 300. In other words, integrated circuit devices are formed on each of the integrated circuit device regions, and the spaces therebetween make up the scribe line regions. The wafer can then be cut along the scribe line regions to separate the integrated circuit devices.

Reference character A denotes an area wherein two scribe lines regions intersect, and reference character B denotes the width of an integrated circuit device region. FIGS. 3 and 4 are magnified views of area A of FIG. 2 according to alternate aspects of the present invention.

As shown in FIG. 3, the scribe line regions 300 can extend horizontally and vertically at right angles to one another separating the rectangular integrated circuit device (chip) regions 200. In addition, the elongated grooves 400 are formed in the semiconductor substrate along the scribe line regions 300 thereof. The elongated grooves can extend the full length of the respective scribe line regions, or the elongated grooves can extend a predetermined distance from the intersections of the scribe line regions.

As shown in FIG. 4, the scribe line regions 300 again extend horizontally and vertically. In FIG. 4, however, the grooves 500 are rectangular (or more particularly square) within the respective scribe line regions. The spaced apart grooves 500 can extend the full length of the respective scribe line regions, or the spaced apart grooves 500 can be provided extending a predetermined distance along the scribe line regions from intersections between scribe line regions.

The grooves of FIGS. 3 and 4 can be formed by forming an oxide layer on the device surface of a semiconductor wafer including the integrated circuit device regions and the scribe line regions, forming a photoresist layer of the oxide layer, and patterning the oxide layer using known photolithographic techniques. In particular, the oxide layer is patterned so that portions of the scribe line regions of the wafer corresponding to the desired locations of the grooves are exposed. The exposed portions of the scribe line regions of the wafer are then etched using the patterned oxide layer as an etching mask. The patterned oxide layer can then be removed, and integrated circuit devices formed on the integrated circuit device regions of the wafer.

The grooves can be formed as continuous lines in the scribe line areas, a plurality of individual grooves can be spaced apart within each of the scribe line areas, or the grooves can have other shapes. In addition, grooves can be formed on portions of the integrated circuit device regions that will not be used in the subsequent formation of the integrated circuit devices.

As discussed above, the grooves are preferably formed on the semiconductor wafer before circuit patterns are formed in the integrated circuit device regions to reduce wafer warping during subsequent formation of the integrated circuit devices. Alternately, the grooves can be formed at any point during the formation of the integrated devices as long as the formation of the grooves precedes a step during which the wafer may be warped. Wafer warping during the formation of integrated circuit devices can thus be reduced. Preferably, the grooves are formed in the scribe line regions in predetermined intervals and patterns.

Figure 5:
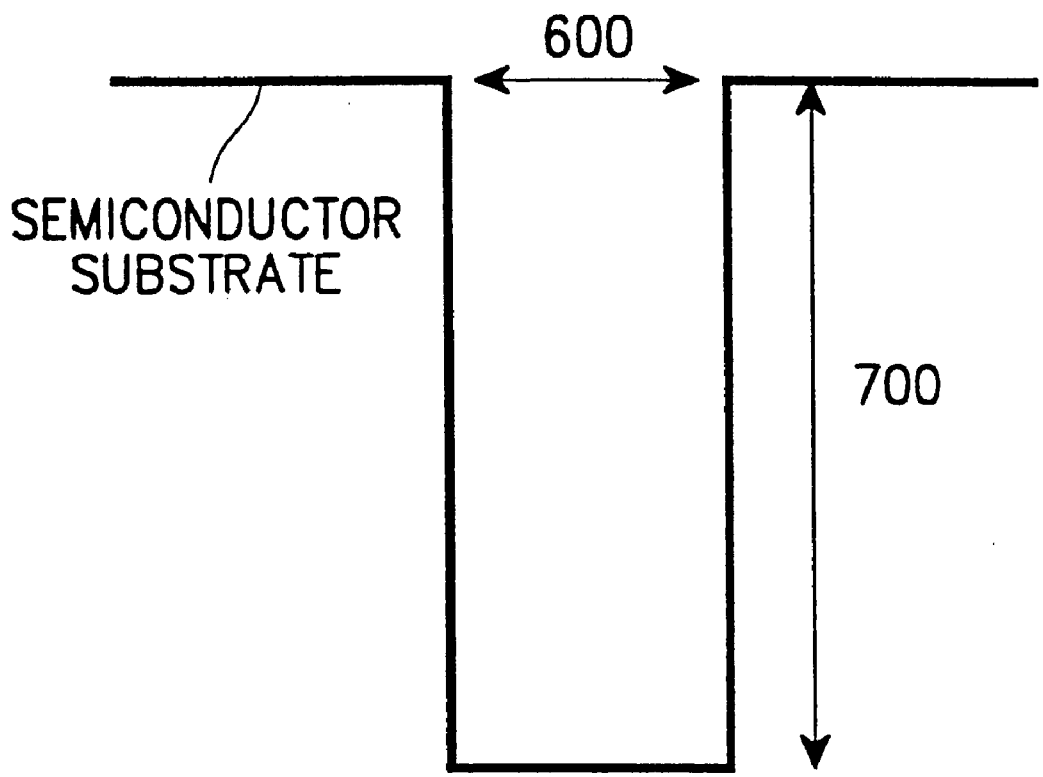
FIG. 5 is a cross sectional view of a groove taken along section line I
40 of FIGS. 3 and 4.

FIG. 5 is a cross sectional view of a wafer taken along section lines I–I' of FIGS. 3 and 4 showing a cross section of a groove in a semiconductor substrate according to the present invention. As shown, a groove according to the present invention can be formed in the face of a semiconductor wafer such as a single crystal silicon wafer. More particularly, the groove can have a width indicated by reference number 600 and a depth indicated by reference number 700. The width 600 of the grooves 400 and 500 is preferably at least two times greater than the total thickness of the layers deposited in the subsequent steps used to form the integrated circuit devices in the integrated circuit device regions. This width is desirable because the grooves may otherwise be buried during the fabrication of the integrated circuit devices. The depth 700 of the grooves is preferably greater than the total thickness of the layers deposited in the steps used to form the integrated circuit devices in the integrated circuit device regions. This depth also helps to reduce the possibility that the grooves are buried during the formation of the integrated circuit devices.

As discussed above, concave warping of a semiconductor wafer can be reduced by forming layers of a common material on both the device side and the back side of a semiconductor wafer and then removing the layer on the backside of the wafer. Convex warping can be reduced by forming grooves in the scribe line regions of the wafer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor wafer comprising:

device regions on a face of the semiconductor wafer wherein an integrated circuit device can be formed on each of the device regions;

scribe line regions on the face of the semiconductor wafer wherein adjacent device regions are separated by the scribe line regions; and grooves in the surface of the semiconductor wafer wherein the grooves are within the scribe line regions of the semiconductor wafer to reduce distortion thereof during subsequent fabrication of a plurality of integrated circuit devices in the device regions and wherein the grooves comprise a plurality of separate grooves in each of the scribe line regions;

wherein two of the scribe lines intersect and wherein separate grooves within the intersecting scribe lines intersect to form an X-shaped groove such that no leg of the X-shaped groove extends to a second intersection of scribe lines wherein the X-shaped groove has a predetermined depth that is less than a thickness of the wafer.

2. A semiconductor wafer according to claim 1 wherein at least one of the separate grooves is rectangular.

3. A semiconductor wafer according to claim 1 further comprising:

an integrated circuit device in at least one of the integrated circuit device regions.

4. A semiconductor wafer according to claim 1 wherein the grooves have a depth that is greater than a total thickness of layers making up the integrated circuit devices.

5. A semiconductor wafer according to claim 1 wherein each of the grooves has a width that is at least two times greater than a total thickness of layers making up the integrated circuit devices.

* * * * *